United States Patent

Pilz

(10) Patent No.: US 9,762,290 B2
(45) Date of Patent: Sep. 12, 2017

(54) PLUG CONNECTING UNIT FOR CONNECTING A CABLE CIRCUIT WITH A SENSOR MODULE

(71) Applicant: Endress + Hauser Conducta Gesellschaft für Mess- und Regeltechnik mbH + Co. KG, Gerlingen (DE)

(72) Inventor: Stefan Pilz, Geithain (DE)

(73) Assignee: Endress+Hauser Conducta GmbH+Co. KG, Gerlingen (DE)

( * ) Notice: Subject to any disclaimer, the term of this patent is extended or adjusted under 35 U.S.C. 154(b) by 835 days.

(21) Appl. No.: 14/102,746

(22) Filed: Dec. 11, 2013

(65) Prior Publication Data

US 2014/0167519 A1  Jun. 19, 2014

(30) Foreign Application Priority Data

Dec. 13, 2012 (DE) .................. 10 2012 112 221
Oct. 16, 2013 (DE) .................. 10 2013 111 405

(51) Int. Cl.
*H01F 27/42* (2006.01)
*H04B 5/00* (2006.01)
*H05K 9/00* (2006.01)

(52) U.S. Cl.
CPC ......... *H04B 5/0031* (2013.01); *H05K 9/0018* (2013.01); *H04B 5/0012* (2013.01); *H04B 5/0075* (2013.01)

(58) Field of Classification Search
CPC .. H04B 5/0012; H04B 5/0031; H04B 5/0075; H05K 9/0018

USPC .......................................... 307/104
See application file for complete search history.

(56) References Cited

U.S. PATENT DOCUMENTS

| 4,236,086 A | 11/1980 | Hoebel |
| 6,476,520 B1 | 11/2002 | Bohm et al. |
| 8,396,683 B2 | 3/2013 | Buschnakowski |
| 2002/0129633 A1 | 9/2002 | Joki |

(Continued)

FOREIGN PATENT DOCUMENTS

| CN | 101821592 A | 9/2010 |
| CN | 202471095 U | 10/2012 |

(Continued)

OTHER PUBLICATIONS

Jul. 23, 2013 German Search Report, German Patent Office, Munich, Germany.

(Continued)

*Primary Examiner* — Jared Fureman
*Assistant Examiner* — Duc M Pham
(74) *Attorney, Agent, or Firm* — Christopher R. Powers; PatServe

(57) ABSTRACT

A plug connecting unit for connecting a cable circuit in a cable circuit housing with a sensor module in a sensor module housing, comprising a wireless interface for energy- and/or data transmission between the cable circuit and the sensor module. A first section of the wireless interface is arranged in the cable circuit and a second section of the wireless interface is arranged in the sensor module. The wireless interface is surrounded by a magnetic shielding and the magnetic shielding is arranged in the cable circuit housing and/or in the sensor module housing.

11 Claims, 2 Drawing Sheets

(56) References Cited

U.S. PATENT DOCUMENTS

| | | | |
|---|---|---|---|
| 2003/0016017 A1* | 1/2003 | Reykowski | G01R 33/341 |
| | | | 324/322 |
| 2008/0034864 A1 | 2/2008 | Wittmer | |
| 2008/0164867 A1* | 7/2008 | Steinich | G01D 5/145 |
| | | | 324/207.2 |
| 2012/0062214 A1* | 3/2012 | Bares | H01R 13/6633 |
| | | | 324/173 |

FOREIGN PATENT DOCUMENTS

| | | |
|---|---|---|
| DE | 19719730 C1 | 10/1998 |
| DE | 10220450 A1 | 11/2003 |
| WO | 03096139 A2 | 11/2003 |

OTHER PUBLICATIONS

Nov. 27, 2012 Wikipedia search on Abschirmung (Elektrotechnik) (translated to Shielding Electrical Engineering), URL: http://de.wikipedia.org/w/index.php, 4 pages.

* cited by examiner

PLUG CONNECTING UNIT FOR CONNECTING A CABLE CIRCUIT WITH A SENSOR MODULE

TECHNICAL FIELD

The invention relates to a plug connecting unit for connecting a cable circuit with a sensor module. The plug connecting unit comprises a wireless interface for energy- and/or data transmission between the cable circuit and the sensor module. The first section of the interface lies in the cable circuit and the second section of the interface lies in the sensor module.

BACKGROUND DISCUSSION

In process automation technology, a large number of different sensors are applied for registering process variables. Examples of such sensors include pH sensors, gas sensors, flow sensors, mass flow sensors and the like. In modern industrial plants, such sensors are often operated under difficult environmental conditions. For example, the sensors are exposed to corrosive chemicals, heat, vibration and the like.

The sensors are arranged, in such case, at measuring points composed of a sensor element and a sensor cable, which connects the sensor with a measurement transmitter. In some cases of application, the sensor is placed in a retractable assembly of stainless steel or a durable synthetic material, such as a plastic, in order to enable insertion of the sensor into, and withdrawal from, the process.

Known from German patent, DE 10 2007 048 812 A1 is a cable circuit with digital signal conditioning. The cable circuit serves for connecting a sensor module with a measurement transmitter. The cable circuit includes a contactless interface for signal transmission between the circuit formed in the cable and the sensor module, wherein the sensor module is galvanically isolated from the cable circuit and signal transmission between the cable circuit and the sensor module occurs by optical, inductive or capacitive means. Furthermore, also the energy supply for the sensor module occurs via this wireless interface. The wireless interface is, in such case, positioned partly in the cable circuit and partly in the sensor module, wherein the two parts of the wireless interface are arranged lying opposite one another by introducing the cable circuit into the sensor module. The housings of the sensor module and the cable have a relatively small diameter, for example 12 mm. The sensor can be applied in a retractable assembly (see below), so that the maximum outer dimensions are predetermined. As already mentioned, a part of the signal conditioning occurs in a circuit in the sensor and/or in the cable. The components required for conditioning, such as a microprocessor, other active components as well as passive components, must be accommodated in the predetermined spatial conditions. The wall thickness of the housing of the cable, respectively of the sensor module, as caused by the relatively small housing diameters, is very small and lies at, for instance, 1-2 mm.

Especially when the wireless interface is embodied as a stray field transformer, whose primary winding is arranged in the cable circuit and whose secondary winding is arranged in the sensor module, there arise in the energy- and data transmission magnetic stray fields, which lie also outside of cable and sensor housings. Through the installation of such a plug connecting unit in a, for example, tubular, stainless steel assembly for inserting the sensor module into a medium to be examined, the stainless steel assembly influences the stray fields. On the one hand, the stainless steel assembly acts like a second secondary winding, which is electrically short circuited. On the other hand, there arise in the stainless steel assembly eddy current losses. Therewith, the effective inductance and the effective quality of the primary winding are changed in such a manner that the working point of the primary winding is changed and the efficiency of cable including sensor is reduced. This has the result that both the energy—as well as also the data transmission are negatively influenced.

SUMMARY OF THE INVENTION

An object of the invention is, thus, to provide a plug connecting unit, which, under given space requirements, especially with a smallest possible space requirement, assures reliable energy- and/or data transmission between a cable circuit and a sensor module.

According to the invention, the object is achieved by features including that the wireless interface is surrounded by a magnetic shielding, which is arranged in the cable circuit housing and/or in the sensor module housing. Thus, a secure transmission is enabled in the presence of the given space requirements. The magnetic shielding has the advantage that the magnetic circuit of the plug connecting unit is changed in such a manner that it exists only within the cable circuit and the sensor module. The stray field outside of the cable circuit and the sensor module is, in such case, so small that effects on energy- and data transmission are eliminated.

Advantageously, the wireless interface is embodied as an inductive or capacitive interface. Especially in the case of such physical principles, it is necessary to use shielding, in order to suppress an influencing of the functioning of the interface by external, stray fields.

In a variant, the magnetic shielding is composed of a film or a sheet, which is arranged in the interior of the cable circuit housing and/or the sensor module housing. In this way, the magnetic shielding can be constructively simple and cost effective to manufacture.

Advantageously, the magnetic shielding is placed in a cable circuit housing of plastic and/or in the sensor module housing of plastic. Thus, an adjustment of two layers composed of housing and shielding relative to one another is not needed, when the ferromagnetic material is, for example, injection molded around the plastic.

In a form of embodiment, the cable circuit housing and/or the sensor module housing are produced completely or partially of a plastic bonded ferrite. Thus, the cable circuit housing and the sensor module housing are of a material, which serves simultaneously as magnetic shielding.

In an additional variant, the magnetic shielding is embodied in at least one region of the cable circuit housing, which surrounds the first section of the wireless interface and/or at least in a region of a sensor module housing, which surrounds the second section of the wireless interface. In this form, a minimum measure of shielding is provided relative to external, stray fields. The magnetic field, which is produced by the inductive or capacitive interface, extends more in the interior of the cable circuit, respectively in the interior of the sensor module, the more complete the magnetic shielding of the cable circuit housing, respectively the magnetic shielding of the sensor module housing.

In an embodiment, the magnetic shielding is composed of a material with a relative permeability >1. Selection of a material with such permeability assures shielding of stray fields outside the plug connecting unit.

The magnetic shielding can be produced of a large number of materials. Especially when the magnetic shielding is composed of a ferromagnetic material, an especially high relative permeability is achieved.

Advantageously, the magnetic shielding of a conductive material is embodied tubularly and includes a longitudinal slit. The longitudinal slit suppresses the occurrence of a secondary short circuit winding.

In a preferred embodiment, the cable circuit housing and the sensor module housing are tubularly embodied and have a diameter of about 12 mm. The housings should especially be so embodied that they can be applied in a retractable assembly.

BRIEF DESCRIPTION OF THE DRAWINGS

The invention permits numerous forms of embodiment. A selection thereof will now be explained in greater detail based on the drawing, the figures of which show as follows, wherein equal features are provided with equal reference characters.

DETAILED DISCUSSION IN CONJUNCTION WITH THE DRAWINGS

Figure 1:
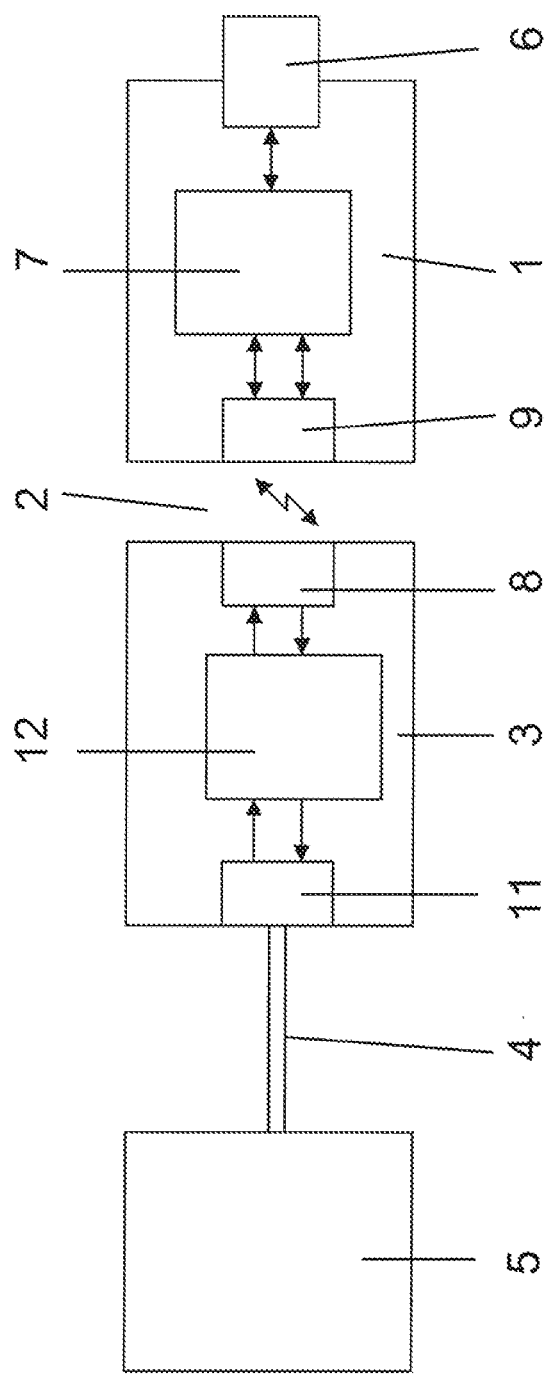
FIG. 1 shows data exchange between the measurement transmitter, the cable circuit and the sensor module.

FIG. 1 shows a plug connecting unit for registering and forwarding measured values. This plug connecting unit includes a sensor module 1, which communicates with a cable circuit 3 via a wireless interface 2. The wireless interface 2 is, in such case, embodied as an inductive interface. In order to be able to forward the data registered in the sensor module 1 to a superordinated system, the cable circuit 3 is connected via a cable 4 with a measurement transmitter 5. Parts of the tasks of the measurement transmitter 5 can be assumed by the cable circuit 3. Thus, for example, it is also possible to connect the sensor module 1 directly to a bus.

Sensor module 1 includes a sensor 6, which is applied in the the field of process automation, thus, for example, a flow sensor, a mass flow sensor, a pH sensor, a gas sensor or the like. Within the sensor module 1, sensor 6 is connected with an electronic circuit 7, which is coupled, in turn, with the wireless inductive interface 2. The inductive interface 2 includes a primary winding 8 arranged on the cable circuit side as well a secondary winding 9 arranged on the sensor module side. Secondary winding 9 is connected with the electronic circuit 7. When the sensor module 1 is plugged onto the cable circuit 3 by means of a pluggable connector coupling, the primary winding 8 and the secondary winding 9 are brought into a defined spatial positioning relative to one another, so that high frequency signals can be transmitted in both directions between the cable circuit 3 and the sensor module 1. In this way, data exchange between cable circuit 3 and sensor module 1 is enabled.

Moreover, also the energy supply of the sensor module 1 can occur via the inductive interface 2. In this regard, the high-frequency signal of the cable circuit 3 produced in the electrical circuit 12 is received by the secondary winding 9 of the sensor module 1, in order to serve as operating voltage for the electronic circuit 7 and the sensor 6. In addition to the wireless interface 2, the cable circuit 3 includes an interface 11 with the cable 4, via which data exchange with the measurement transmitter 5 occurs.

Figure 2:
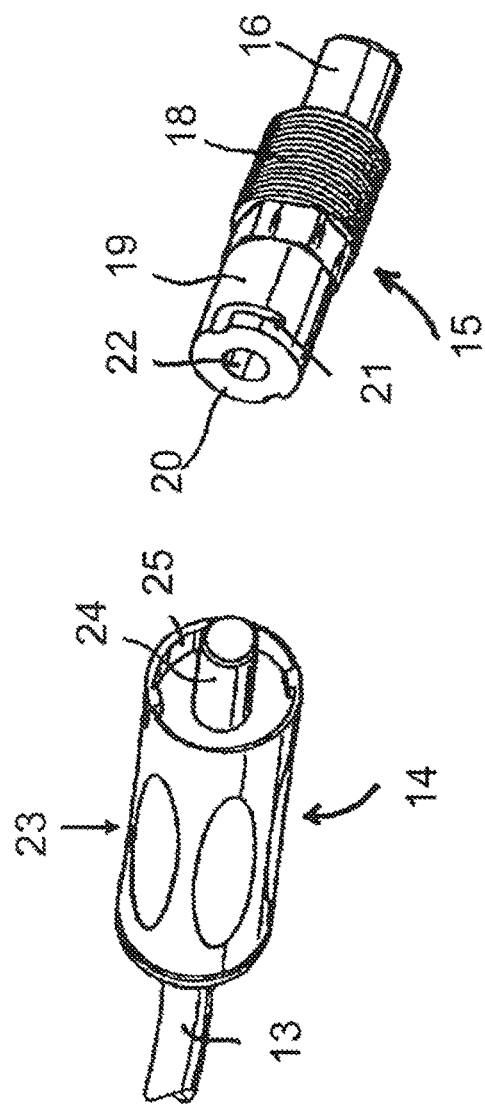
FIG. 2 is an example of an embodiment of cable circuit and sensor module.

FIG. 2 shows an example of an embodiment of a cable circuit 14 arranged on the end of a cable 13. Moreover, a sensor module 15 is shown, which can be connected with the cable circuit 14 via the pluggable connector coupling, so that data- and energy transmission can occur via the inductive interface 2. Sensor module 15 includes a sensor 16 for registering measured values. The sensor module housing 17 includes a screw thread 18, in order to be able to mount the sensor module 15 in a stainless steel, retractable assembly (not shown). Provided on the end of the sensor module 15 facing away from the sensor 16 is a cylindrical end section 19, in which a secondary winding 20 of the inductive interface 2 is arranged. Located in the lateral surface of the cylindrical end section 19 are the cutouts of a bayonet connector 21.

Cylindrical end section 19 of the sensor module 15 includes a frontend cavity 22, which serves to accommodate a cylindrical protrusion 24 formed on the cable circuit housing 23. Located within the cylindrical protrusion 24 is a ferrite core equipped with the primary winding of the inductive interface 2. During plugging of the cable circuit 14 into the sensor module 15, the primary winding arranged within the protrusion 24 is brought into a defined spatial position relative to the secondary winding 20, so that data- and energy transmission between the cable circuit 14 and the sensor module 15 can take place. Radially inwards extending lugs on the sleeve-like lateral surface 25 of the cable circuit 14 are then engaged in the cutouts of the bayonet connector 21 and secure the plugged connection. Cable circuit housing 23 and sensor module housing 24 are tubularly embodied and have a diameter of 12 mm. The wall thickness of the housings 23, 24 amounts to about 1 mm, so that the cable circuit 15, respectively the sensor module 15, must be emplaced in the interior within the remaining 10 mm.

Figure 3:
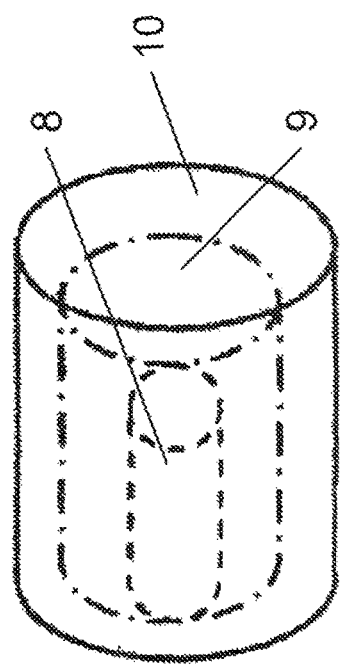
FIG. 3 is an example of an embodiment of the shielding of an inductive interface according to FIG. 2.

FIG. 3 shows a magnetic shielding 10 for enveloping the primary winding 8 and the secondary winding 9. Magnetic shielding 10 is composed of a ferromagnetic material and is tubularly formed in a first embodiment preferably of a film or a sheet. The cable circuit housing 23 as well as the sensor module housing 17 are formed of plastic and, such as explained with reference to FIG. 2, are likewise tubularly embodied. In the mounted state, the magnetic shielding 10 surrounds at least the inductive interface 2 of the plug connecting unit and, thus, the primary winding 8 and the secondary winding 9. In such case, there are different options for arranging the magnetic shielding 10 on the plug connecting unit. Magnetic shielding 10 can be placed internally both on the cable circuit housing 23 as well as also on the sensor module housing 17. An especially elegant solution is that where the sensor module housing 17 and the cable circuit housing 23 are of plastic, into which the magnetic shielding 10 is introduced. In an additional alternative, the shielding 10 can be adhered to the primary winding 8, respectively the secondary winding 9. Magnetic shielding 10 can, in such case, be embodied as a closed body or also as a slitted body. A slitted body is advantageous when the material of the magnetic shielding 10 is electrically conductive, in order to suppress the forming of a secondary, short circuit winding.

The explained plug connecting unit has the advantage that energy- and data transmission between the sensor module 1, 15 and the cable circuit 3, 14 takes place uninfluenced by external magnetic fields. In such case, also magnetically active, external environmental conditions, such as, for example, from the stainless steel, retractable assemblies, which accommodate the sensor module, are eliminated. Also, adjoining sensor modules, which are embodied in the same manner with an inductive interface 2, are not influenced by one another, since the magnetic shielding 10 is present.

The invention claimed is:

1. A plug connecting unit for connecting a cable circuit in a cable circuit housing with a sensor module in a sensor module housing, comprising:
   a wireless interface for energy and/or data transmission between the cable circuit and the sensor module, wherein:
   a first section of said wireless interface lies in the cable circuit, and a second section of said wireless interface lies in the sensor module;
   said wireless interface is surrounded by a magnetic shielding of a conductive material, the magnetic shielding being tubularly embodied and including a longitudinal slit; and
   said magnetic shielding is arranged in the cable circuit housing and/or in the sensor module housing.

2. The plug connecting unit as claimed in claim 1, wherein:
   said wireless interface is embodied as an inductive or capacitive interface.

3. The plug connecting unit as claimed in claim 1, wherein:
   said magnetic shielding is composed of a film or a sheet, which is arranged in the interior of the cable circuit housing and/or sensor module housing.

4. The plug connecting unit as claimed in claim 1, wherein:
   said magnetic shielding is placed in a cable circuit housing of plastic and/or in a sensor module housing of plastic.

5. The plug connecting unit as claimed in claim 4, wherein:
   said cable circuit housing and/or the sensor module housing are produced completely or partially of a plastic bonded ferrite.

6. The plug connecting unit as claimed in claim 5, wherein:
   the magnetic shielding is embedded in the cable circuit housing and/or the sensor module housing via the plastic bonded ferrite material.

7. The plug connecting unit as claimed in claim 4, wherein:
   said magnetic shielding is embodied in at least one region of the cable circuit housing, which surrounds said first section of said wireless interface, and/or at least in a region of a sensor module housing, which surrounds said second section of said wireless interface.

8. The plug connecting unit as claimed in claim 1, wherein:
   said magnetic shielding is composed of a material with a relative permeability >1.

9. The plug connecting unit as claimed in claim 8, wherein:
   said magnetic shielding is ferromagnetic.

10. The plug connecting unit as claimed in claim 1, wherein:
    the cable circuit housing and the sensor module housing are tubularly embodied and have a diameter of about 12 mm.

11. The plug connecting unit as claimed in claim 1, wherein:
    the magnetic shielding is incorporated within the cable circuit housing and/or the sensor module housing in a material of the cable circuit housing and/or the sensor module housing.

* * * * *